(12) United States Patent
Sorimachi et al.

(10) Patent No.: US 6,791,186 B2
(45) Date of Patent: Sep. 14, 2004

(54) MOUNTING SUBSTRATE AND STRUCTURE HAVING SEMICONDUCTOR ELEMENT MOUNTED ON SUBSTRATE

(75) Inventors: Haruo Sorimachi, Nagano (JP); Yoshihiro Yoneda, Matto (JP)

(73) Assignee: Shinko Electric Industries Co., Ltd., Nagano (JP)

(*) Notice: Subject to any disclaimer, the term of this patent is extended or adjusted under 35 U.S.C. 154(b) by 236 days.

(21) Appl. No.: 10/127,640

(22) Filed: Apr. 22, 2002

(65) Prior Publication Data

US 2002/0162684 A1 Nov. 7, 2002

(30) Foreign Application Priority Data

May 1, 2001 (JP) ........................................ 2001-134278

(51) Int. Cl.[7] .......................... H01L 23/48; H05K 1/03; H05K 1/18
(52) U.S. Cl. ........................ 257/738; 257/778; 257/779; 257/786; 174/255; 174/263; 361/764; 361/767; 361/774; 361/777
(58) Field of Search ................................. 361/748, 749, 361/760–762, 764, 767, 772–774, 777; 257/737, 738, 778–780, 783, 786; 228/175, 180.21, 180.22; 174/250, 260, 253–255, 261–263; 438/108, 109, 612, 613; 29/846, 847, 857, 860, 874

(56) References Cited

U.S. PATENT DOCUMENTS 5,252,781 A * 10/1993 Shirai et al. ................ 174/261
5,517,756 A * 5/1996 Shirai et al. ................... 29/847
6,049,122 A    4/2000 Yoneda ....................... 257/668
6,229,711 B1   5/2001 Yoneda ....................... 361/760
2004/0040742 A1 * 3/2004 Ishizaki ....................... 174/257

* cited by examiner

Primary Examiner—Alonzo Chambliss
(74) Attorney, Agent, or Firm—Paul & Paul

(57) ABSTRACT

A mounting substrate on which a semiconductor element is to be mounted by flip-chip bonding, the semiconductor element having a surface on which a plurality of electrode terminals are arranged in a line, each of said electrode terminals having a protruded electrode formed thereon, wherein the surface of the mounting substrate on which the semiconductor element is to be mounted is provided with a protective film having an opening corresponding to an area of the semiconductor element where the protruded electrodes are located, a plurality of connection electrodes being arranged in the opening, the connection electrodes being provided with a solder for bonding it to the protruded electrodes, and being arranged at the same interval as that of the protruded electrodes, and each of the connection electrodes being connected to a wiring pattern of the mounting substrate, and wherein the length of a portion of the connection electrode from the center of the opening to the end thereof that is not connected with the wiring pattern is 150 $\mu$m or larger. A structure having a semiconductor element mounted on the substrate is also disclosed.

36 Claims, 11 Drawing Sheets

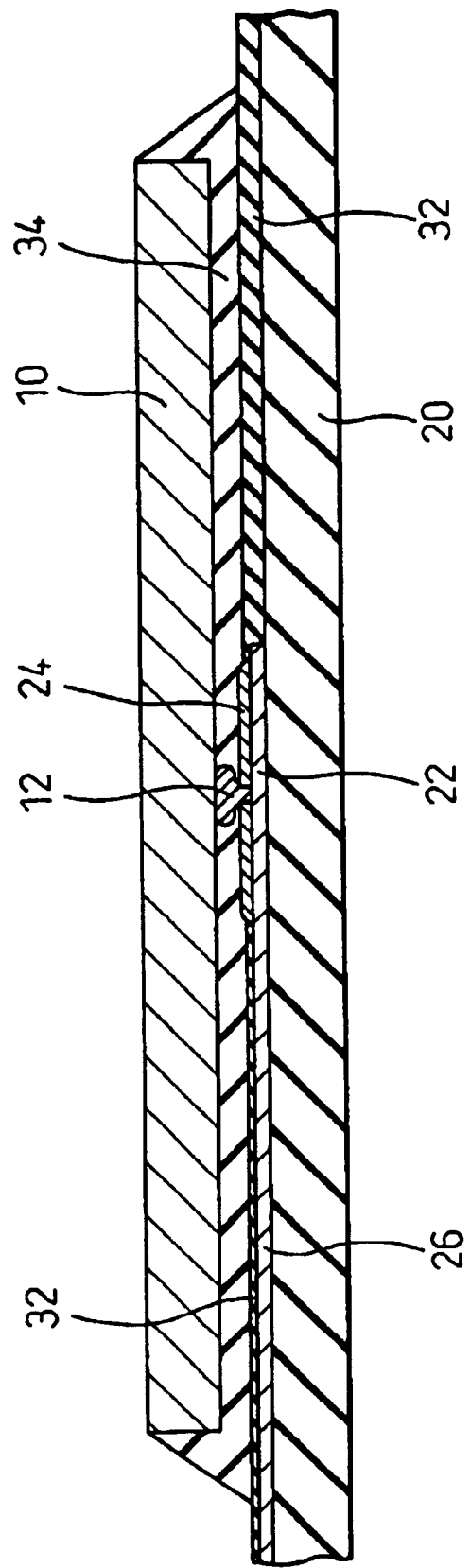

MOUNTING SUBSTRATE AND STRUCTURE HAVING SEMICONDUCTOR ELEMENT MOUNTED ON SUBSTRATE

BACKGROUND OF THE INVENTION

1. Field of the Invention

The present invention relates to a mounting substrate and a structure having a semiconductor element mounted on the substrate and, more particularly, to a mounting substrate for mounting thereon a semiconductor element having a line of electrode terminals and a structure having a semiconductor element mounted on the substrate.

2. Description of the Related Art

A structure, in which a semiconductor element is mounted on a substrate by flip chip bonding, the semiconductor element comprising a plurality of electrode terminals arranged in two rows at the central portion of the surface thereof, is known. FIG. 12 shows a method of mounting a semiconductor element 10 on a substrate 20 to provide such a structure. Electrode terminals (not shown) of the semiconductor element 10 are each provided with a protruded electrode 12 of a gold bump, and connection electrodes 22 are arranged, corresponding to the protruded electrodes 12, on the surface of the substrate 20 on which the semiconductor element 10 is to be mounted. The connection electrodes 22 and the protruded electrodes 12 are aligned with each other, and the semiconductor element 10 is mounted on the substrate 20. The surface of the connection electrodes 22 is deposited with solder (not shown). The semiconductor element 10 is heated to a temperature at which the solder is melted, and the protruded electrodes 12 are bonded under pressure to the connection electrodes 22.

FIG. 13 is a sectional view showing a structure in which the semiconductor element 10 is mounted on the substrate 20. The connection electrodes 22 arranged on the surface of the substrate 20 where the semiconductor element is to be mounted include solder deposited on the surface of a copper pattern 23.

The protruded electrodes 12 of the semiconductor element 10 are arranged in two rows. The connection electrodes 22 are also arranged in two rows on the substrate 20 at positions corresponding to the protruded electrodes 12. The connection electrodes 22 are exposed from the protective film 32, such as a solder mask, covering the surface of the substrate 20 on which the semiconductor element is to be mounted. Actually, as shown in FIG. 12, the area of the surface of the substrate 20, in which the semiconductor element 10 is to be mounted and the connection electrodes 22 are arranged, constitutes an exposed rectangular opening 30. The solder 24 on the connection electrodes 22 is exposed in the opening 30, while the portion other than the opening 30 is covered with a protective film 32, such as a solder mask, as shown in FIG. 13. The connection electrodes 22 are each connected with a wiring pattern 26, which in turn is covered by the protective film 32.

Apart from the structure as shown in FIG. 12 in which the semiconductor element having protruded electrodes arranged in two rows is mounted by flip-chip bonding, there is a structure in which a product, such as a memory chip, having a plurality of protruded electrodes arranged in a single row substantially along the center line of the product is mounted. In the structure in which a product having the protruded electrodes arranged in a single row is mounted on a substrate, the connection electrodes of the substrate are also arranged in a single row at positions corresponding to the protruded electrodes.

In the case where a semiconductor element with protruded electrodes arranged in one row is mounted as described above, the problem described below is posed.

FIG. 14A shows the substrate 20 aligned with the semiconductor element 10 having a protruded electrode 12. FIG. 14B shows the state in which the protruded electrode 12 is brought into contact with the connection electrode 22 of the substrate 20 and heated under pressure to thereby bring the end surface of the protruded electrode 12 into contact with the surface of the connection electrode 22. As the result of the protruded electrode 12 coming into contact with the connection electrode 22, the connection electrode 22 and the substrate 20 are partially depressed. FIG. 14C shows the state in which the temperature is decreased until the solder 24 on the connection electrode 22 is solidified to thereby release the pressure imparted on the protruded electrode 12.

Once the solder 24 is solidified and the pressure is released from the protruded electrode 12, as shown in FIG. 14C, the semiconductor element 10 comes to be mounted at an angle to the surface of the substrate 20 by the elasticity of the substrate 20 and the connection electrode 22. This is by reason of the fact that, in the case where the protruded electrodes 12 are arranged in two rows as shown in FIG. 13, the distortion imparted on the semiconductor element 10 is distributed equally between the right and left sides in the drawing, whereas in the case where the protruded electrodes 12 are aligned in one row as shown in FIG. 14C, the stress on the semiconductor element 10 loses balance and more strongly acts on one side.

In the case where the semiconductor element 10 is mounted obliquely on the substrate 20 as shown in FIG. 14C, the reliability of electrical connection between the protruded electrodes 12 and the connection electrodes 22 is deteriorated, or the underfill material 34 (FIG. 13C) fails to be sufficiently filled up between the semiconductor element 10 and the substrate 20, thereby forming a void. This derives from the fact that when the semiconductor element 10 is mounted at an angle, the interval between the semiconductor element 10 and the substrate 20 is partially reduced to less than that required to allow the underfill material 34 to be adequately filled therein.

In the case where underfill material is filled after bonding the semiconductor element 10 to the substrate 20, care must be taken not to generate any void in the sealed area. A resin material having a high fluidity is used as the underfill material 34. Nevertheless, it is very difficult for the underfill material to flow sufficiently in the very narrow space between the semiconductor element 10 and the substrate 20. Especially in the region where the protruded electrodes 12 and the connection electrodes 22 are connected with each other and where the underfill material 34 does not easily flow, a void is liable to occur.

SUMMARY OF THE INVENTION

The present invention has been achieved to obviate the aforementioned problems, and an object of the invention is to provide a highly reliable mounting substrate and a structure in which a semiconductor element having protruded electrodes arranged in a line substantially along the center line of a surface of the semiconductor element is mounted on a substrate by flip-chip bonding in such a manner that the protruded electrodes of the semiconductor element and the connection electrodes of the substrate are securely connected electrically to each other, with the underfill material being sufficiently filled in the space between the semiconductor element and the substrate.

According to one aspect of this invention, there is provided a mounting substrate, on which a semiconductor element is to be mounted by flip chip bonding, the semiconductor element having a surface on which a plurality of electrode terminals are formed so as to be arranged in a line, each of the electrode terminals having a protruded electrode formed thereon, wherein the surface of the mounting substrate on which the semiconductor element is to be mounted is provided with a protective film having an opening corresponding to an area of the semiconductor element where the protruded electrodes are located, a plurality of connection electrodes being arranged in the opening, the connection electrodes being provided with a solder for bonding it to the protruded electrodes, and being arranged at the same interval as that of the protruded electrodes, and each of the connection electrodes being connected to a wiring pattern of the mounting substrate, and wherein the length of a portion of the connection electrode from the center of the opening to the end thereof that is not connected with the wiring pattern is 150 μm or larger.

The connection electrodes preferably extend from one edge of the opening to a position under the protective film beyond the other edge of the opening.

Preferably, the length of the portion of the connection electrode from the center of the opening to the end thereof that is not connected with the wiring pattern is not less than 200 μm.

The connection electrodes can each have, at the central portion thereof located in the opening, a connection area wider than the wiring pattern, and have, at both sides of the connection area, an extension area of substantially the same width as the wiring pattern.

Preferably, the number of the wiring patterns connected to the connection electrodes from one side of the opening is substantially equal to the number of the wiring patterns connected to the connection electrodes from the other side of the opening.

Preferably, the opening extends outside of the area on which the semiconductor element is to be mounted, in the same direction as the line of the protruded electrodes of the semiconductor element.

It is especially preferable that the opening extends at least 50 μm outside of the area on which the semiconductor element is to be mounted.

According to another aspect of the invention, there is provided a structure in which a semiconductor element is mounted on a substrate by flip chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the substrate, and wherein the substrate is a mounting substrate of the invention as described above.

BRIEF DESCRIPTION OF THE DRAWINGS

FIG. 7 is a sectional view showing another configuration of the mounting structure according to the invention.

DETAILED DESCRIPTION OF THE INVENTION

A mounting substrate and a structure having a semiconductor element mounted on a substrate according to this invention will be explained below in detail with reference to the accompanying drawings.

Figure 1:
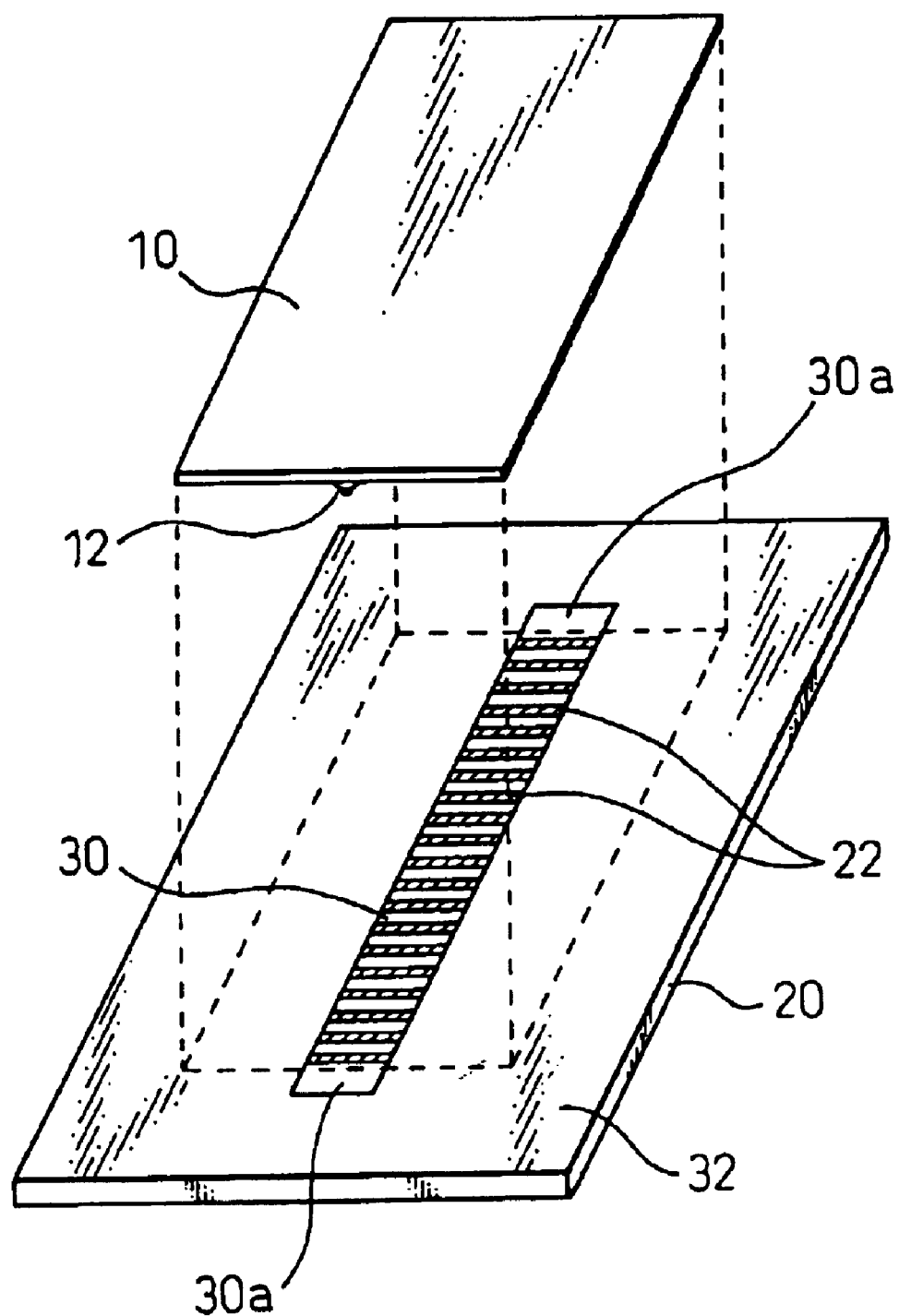
FIG. 1 illustrates a mounting substrate of the invention and the mounting of a semiconductor element on the mounting substrate.

FIG. 1 shows a mounting substrate for mounting thereon a semiconductor element according to a first aspect of the invention. The semiconductor element 10 shown in the drawing is to be mounted by flip chip bonding on a mounting substrate 20. Generally, a plurality of electrode terminals (not shown) each having a protruded electrode 12 thereon are arranged substantially along the center line of a surface of the semiconductor element 10. In similar fashion, a plurality of connection electrodes are arranged along the central portion of the substrate 20 on a surface of the substrate 20 on which the semiconductor element is to be mounted.

A bonding solder (not shown) is deposited on the surface of the connection electrodes 22 for mounting the semiconductor element 10 by flip chip bonding. The surface of the mounting substrate according to this aspect of the invention, on which the semiconductor element 20 is to be mounted, is provided with a rectangular opening in which the connection electrodes 22 are arranged along the length of the opening. A protective film 32, such as a solder mask, covers the surface area other than the opening 30 of the substrate 20.

Each of the connection electrodes 22 is provided in the form of a thin line transversely to the opening 30. These connection electrodes 22 are arranged in parallel with each other at the same interval, in the direction of the line thereof, as the interval of the protruded electrodes 12 of the semiconductor element 10.

Figure 2:
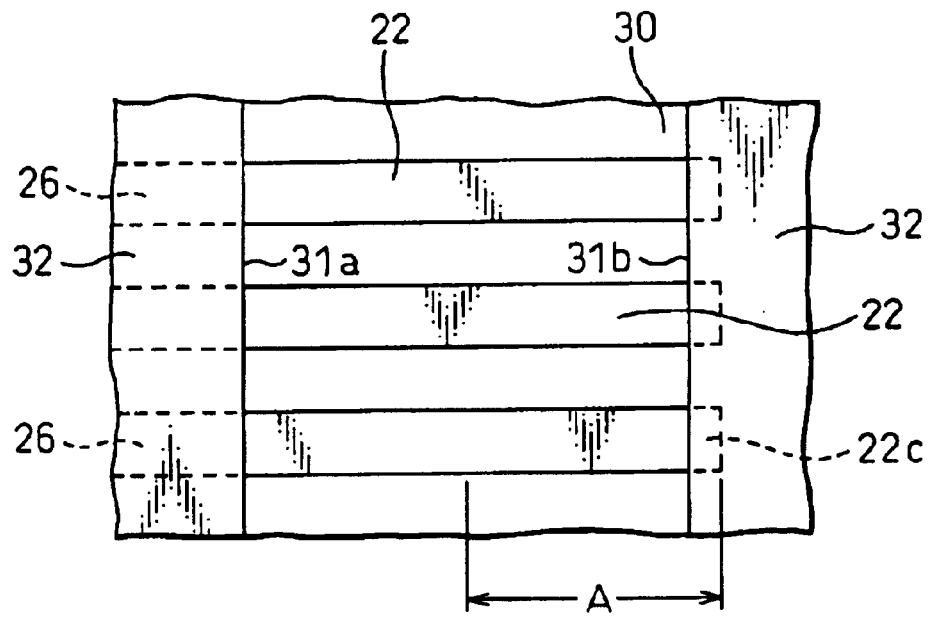
FIG. 2 is an enlarged plan view showing connection electrodes.

FIG. 2 is an enlarged plan view of the connection electrodes 22 formed on the surface of the substrate 20 (FIG. 1)

on which the semiconductor element is to be mounted. Reference numeral 26 designates wiring patterns connected to the connection electrodes 22. The end portion 22c of each of the connection electrodes 22 which is not connected to the wiring pattern 26 is covered with a protective film 32. Solder (not shown) is deposited on the portion of the connection electrode 22 located in the area between the edges 31a, 31b of the opening 30.

The pitches at which the protruded electrodes 12 (FIG. 1) are formed on the semiconductor element 10, though dependent on the semiconductor element, is typically less than 100 μm. The feature of the substrate 20 according to this aspect of the invention lies in that the length of each connection electrode 22 is considerably larger than the interval of adjacent connection electrodes 22 corresponding to the pitch of the protruded electrodes 12. This is important for the problem associated with the prior art of FIG. 14, in which the connection electrode has a shorter length, to be solved.

Figure 14A:
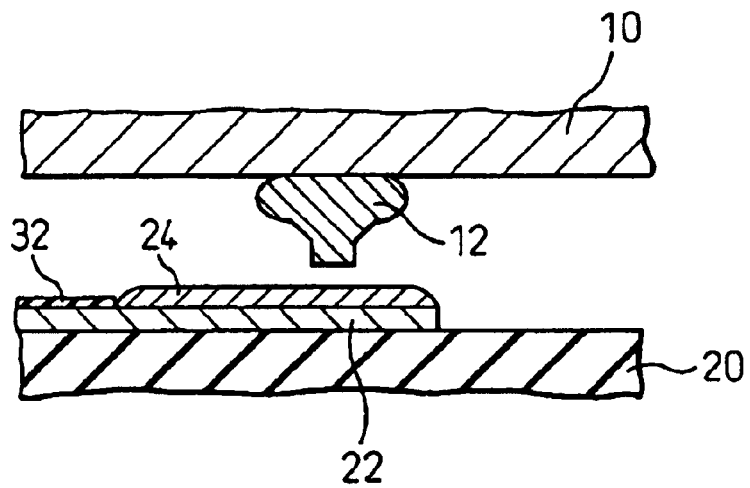
FIGS. 14A to 14C illustrate a conventional method of bonding a semiconductor element to a mounting substrate by heating under pressure.
Figure 14B:
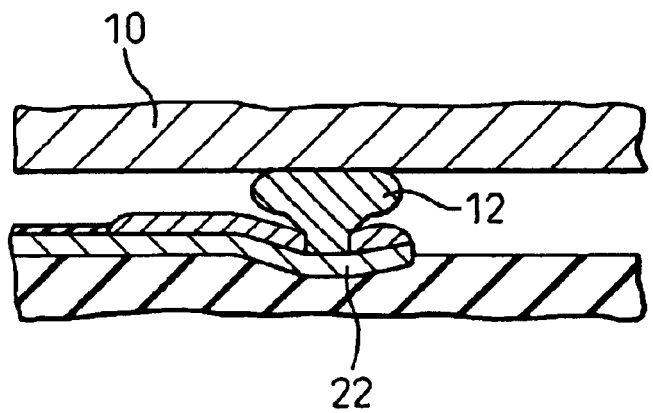
Figure 14C:
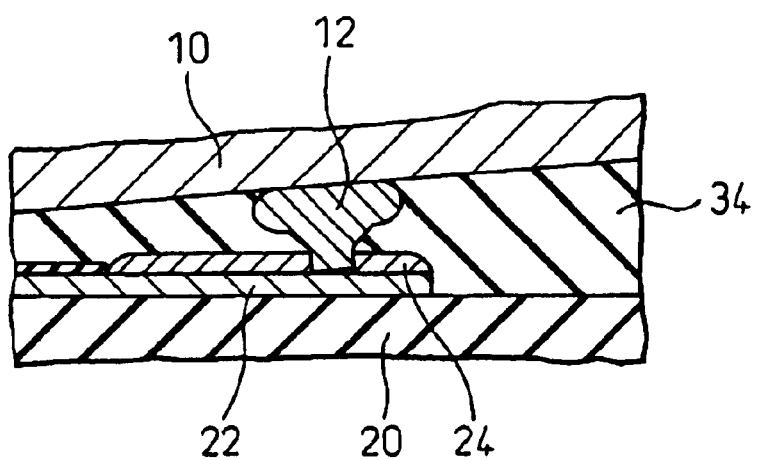

In order to make sure that the semiconductor element 10 is not slanted when mounted on the substrate 20, the protruded electrodes 12 (FIG. 1) of the semiconductor element 10 are each bonded at the center of the length of the opposed connection electrodes 22 arranged between the opposite edge portions 31a, 31b of the opening 30, and the length (designated by A in FIG. 2) of the extension from the junction between the protruded electrode 12 and the connection electrode 22 to the end of the connection electrode 22 is set to an adequate value. As shown in FIG. 14, in the case where the length of the portion of the connection electrode 22 to the end thereof from the junction with the protruded electrode 12 is small, the semiconductor element 10 would be slanted when mounted. In the case where the portion of the connection electrode 22 to the end thereof from the junction with the protruded electrode 12 is larger than a predetermined value, on the other hand, the semiconductor element 10 can be mounted without being slanted.

Figure 3:
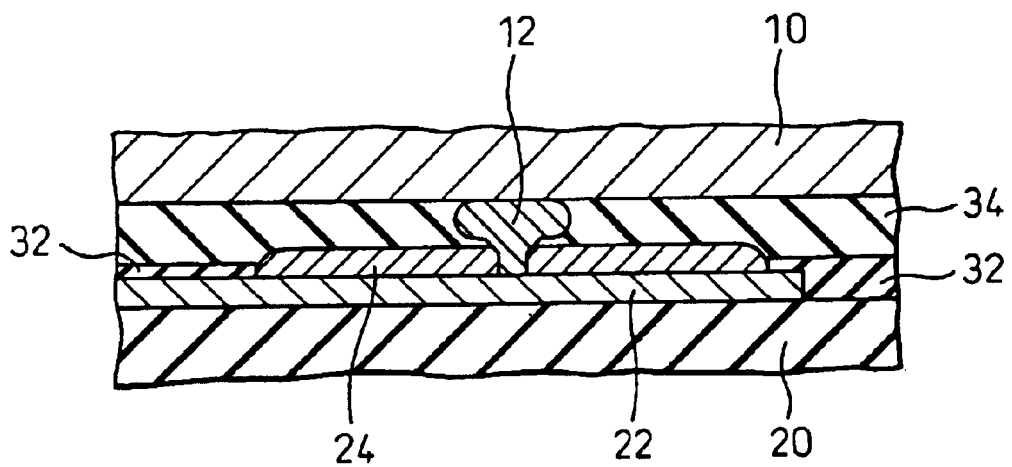
FIG. 3 is a sectional view showing a semiconductor element mounted on a mounting substrate.

FIG. 3 is a sectional view showing a structure in which the semiconductor element 10 is mounted on the mounting substrate 20 shown in FIG. 1. In the structure shown in FIG. 3, an underfill material 34 is filled between the semiconductor element 10 and the mounting substrate 20.

Figure 4A:
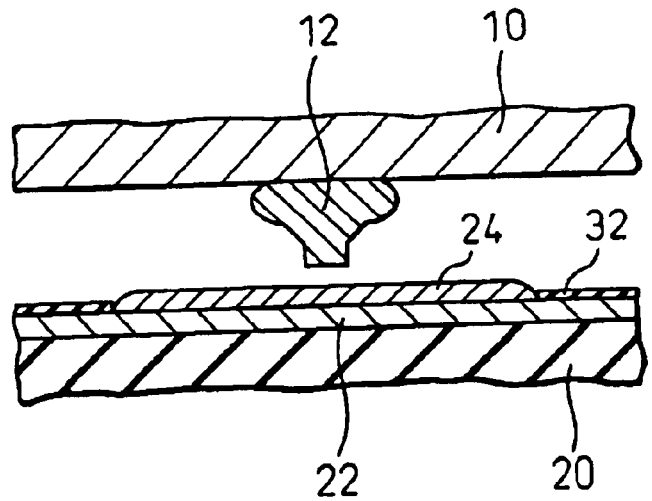
FIGS. 4A to 4C illustrate a method of bonding a semiconductor element to a substrate by heating under pressure.
Figure 4B:
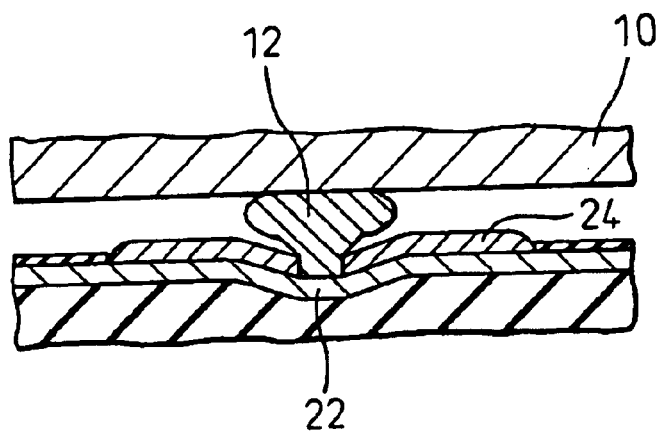
Figure 4C:
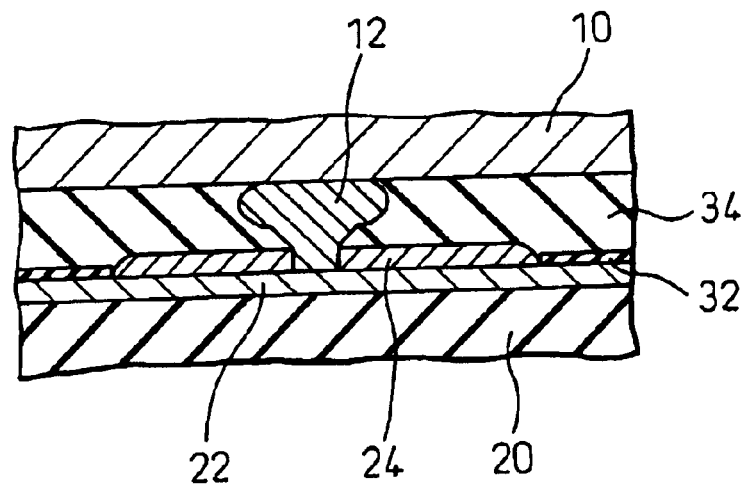

FIGS. 4A to 4C illustrate an operation during the mounting of the semiconductor element 10 on the substrate 20.

FIG. 4A shows the semiconductor element 10 and the substrate 20 aligned with each other. The protruded electrode 12 is positioned at almost the center of the length of the exposed portion of the connection electrode 22 (corresponding to the surface area deposited with the solder 24). Under this condition, the semiconductor element 10 is heated to a temperature at which the solder 24 melts and, then, as shown in FIG. 4B, the protruded electrode 12 is pressed against the connection electrode 22 so that the end surface of the protruded electrode 12 is bonded under pressure to the connection electrode 22. As a result, the portion of the connection electrode 22 and the substrate 20 which is pressed by the protruded electrode 12 is depressed temporarily. When the pressure is released after solidification of the solder 24, however, the original shape is restored with the protruded electrode 12 bonded to the connection electrode 22, as shown in FIG. 4C.

After that, the underfill material 34 is filled between the semiconductor element 10 and the surface of the substrate 10 where the semiconductor element 10 is mounted. The junction between the semiconductor element 10 and the substrate 20 is sealed with the underfill material 34, and a structure is obtained in which the semiconductor element 10 is connected to the substrate 20 by flip chip bonding without being slanted.

As the connection electrode 22 has a considerable length as described above, the semiconductor element 10 can be connected by flip chip bonding on the substrate 20 without being slanted while maintaining a position substantially parallel to the substrate 20. Specifically, in FIG. 2, the length A from the junction between the protruded electrode 12 and the connection electrode 22 to the end of the connection electrode 22 is set to not less than 150 μm, or preferably to not less than 200 μm. The junction between the protruded electrode 12 and the connection electrode 22 is generally located almost at the transverse center of the opening 30. Assuming that the length A is 200 μm, therefore, the transverse length of the opening 30 (which means the width of the opening 30) is slightly smaller than 400 μm.

Figure 5:
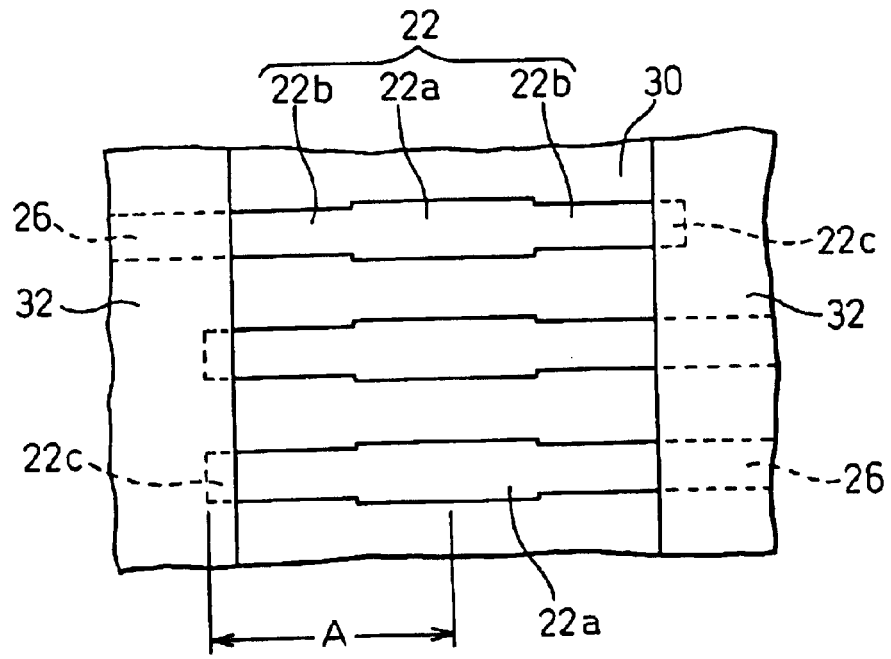
FIG. 5 is an enlarged plan view of connection electrodes in another configuration of mounting substrate according to the invention.

An example of the connection electrode 22 formed on the substrate surface, on which the semiconductor element is to be mounted according to another aspect of the invention, is shown in FIG. 5. According to this aspect of the invention, a connection area 22a wider than the wiring pattern 26 is formed at the central portion of the length of the connection electrode 22, and an extension area 22b as wide as the wiring pattern 26 is formed on both sides of the connection area 22a.

The connection area 22a and the extension areas 22b are exposed at the surface of the substrate 20 on which the semiconductor element is to be mounted and which is located in the opening 30. The surfaces of the areas 22a, 22b are covered by a solder (not shown). The substrate surface is covered with a protective film 32, such as a solder mask, in the region other than the opening 30.

For mounting the semiconductor element on the substrate according to this aspect of the invention, each of the protruded electrodes of the semiconductor element is aligned with the central portion of the opposed connection area 22a of the connection electrode 22, and while the semiconductor element is heated to a temperature at which the solder covering the connection electrodes melts, each protruded electrode is connected by being pressed against the opposed connection electrode 22.

In this aspect of the invention, the connection area 22a primarily contributes to the bonding between the protruded electrode of the semiconductor element and the connection electrode 22 of the mounting substrate. The wider connection area 22a makes it possible to sufficiently secure the amount of the solder required for connection of the protruded electrode and the connection electrode 22, thereby securing electrical connection therebetween, while preventing solder bridging between adjacent extension areas 22b.

The extension area 22b extends comparatively far from both sides of the connection area 22a to balance the stress generated when bonding the semiconductor element to the connection electrode 22 of the substrate under pressure, so that the semiconductor element can be mounted securely on the substrate 20 without being slanted. For this purpose, although in this aspect of the invention the connection area 22a and the extension areas 22b are somewhat lengthened, the length A from the junction between the protruded electrode of the semiconductor element and the connection area 22a of the substrate to the end of the connection electrode 22 shown in FIG. 5 is set to not less than 200 μm, as in the aspects of the invention described above.

In all the aspects of the invention described above, the connection electrode 22 is formed so as to be connected to the wiring pattern 26 on the substrate. In other words, the connection electrodes 22 are each connected with one of the wiring patterns 26.

Connection electrodes 22 and the wiring patterns 26 are formed so as to have a predetermined pattern in a patterning process for fabricating the mounting substrate. In the aspect of the invention shown in FIG. 5, for example, the connection electrodes 22 including the connection area 22a wider than the wiring pattern 26 and the extension area 22b having substantially the same width as the wiring pattern 26 can be formed simultaneously with the wiring pattern by a common patterning process, such as photolithography.

The wiring pattern 26 is connected to at least one of the two ends of the connection electrode 22. In FIG. 2, the wiring patterns 26 are connected to the connection electrodes 22 from the same direction (from left side in FIG. 2), while in FIG. 5, the wiring patterns 26 are each connected to one of the ends of the connection electrode 22 from either of the two directions (right or left in FIG. 5).

Which side of each connection electrode 22 of a mounting substrate is to be connected with the wiring pattern 26 is determined in accordance with the design of a semiconductor element to be mounted on the substrate and the design of the substrate itself. In each aspect described above, the direction from which the wiring pattern 26 is connected to the connection electrode 22 is not particularly significant.

AS shown in FIGS. 2 and 5, each connection electrode 22 is formed to connect to the end of the wiring pattern 26, and is exposed in the interior of the opening 30. For forming the mounting substrate, therefore, it is preferred that the end portion 22c of the connection electrode 22 not connected with the wiring pattern is covered with the protective film 32, such as a solder mask. As a result, the connection electrodes 22 exposed in the opening 39 are deposited with solder uniformly.

Figure 6:
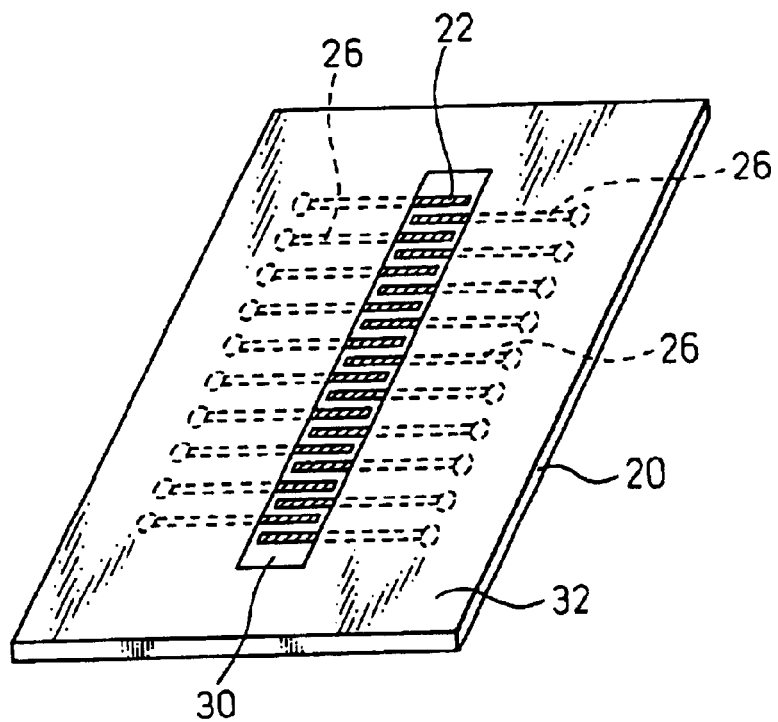
FIG. 6 shows still another configuration of the mounting substrate according to the invention.

FIG. 6 shows the mounting substrate according to still another aspect of the invention. Also, in the mounting substrate 20 according to this aspect, as in the aspects described above, a row of connection electrodes 22 are aligned with the arrangement of a row of protruded electrodes on the semiconductor element 10 (FIG. 1). Along the direction of row of the connection electrodes 22, a rectangular opening 30 is formed in which the connection electrodes 22 are exposed, while the surface of the substrate 20 where the semiconductor element is to be mounted is covered with a protective film 32, in the region other than the opening 30.

The feature of the mounting substrate 20 according to this aspect relates to the arrangement of the wiring patterns 26 connected to the connection electrodes 22 and lies in that the number of the wiring patterns connected to an end of the connection electrodes from one direction is substantially the same as the number of the wiring patterns 26 connected to an end of the connection electrodes 22 from the other direction.

FIG. 6 shows an example in which the wiring patterns 26 are connected to one of the ends of the connection electrodes 22 arranged in the opening 30 from alternately opposed directions. The number of the wiring patterns 26 connected to an end of the connection electrodes 22 from one direction are rendered substantially equal to the number of the wiring patterns 26 connected to an end of the connection electrodes 22 from the other direction in such a manner that as shown in FIG. 6, the wiring patterns 26 are connected to the opposite ends of the connection electrodes alternately, as described above. Nevertheless, the method of equalizing the number of the wiring patterns 22 connected to the opposite ends of the connection electrodes 22 is not limited to the method described above.

For example, some wiring patterns may be connected to an end of corresponding connection electrodes successively from one direction, and other wiring patterns may be connected to an end of corresponding connection electrodes 22 successively from the other direction, in such a manner that the numbers of the wiring patterns connected to the connection electrodes from the opposed directions are the same. The design limitations of the semiconductor element 10 to be mounted and the mounting substrate 20, however, makes it more general to employ the latter method in which some wiring patterns are connected to an end of corresponding connection electrodes successively from the same direction and other wiring patterns are connected to an end of corresponding connection electrodes successively from another direction, rather than the former method in which the wiring patterns are connected to one of the ends of the connection electrodes from alternately opposite directions.

The method of mounting the semiconductor element on the mounting substrate, according to the invention, by flip-chip bonding can be the same as the method described with reference to FIG. 4 above, regardless of the direction or directions in which the wiring patterns 26 are connected to the connection electrodes and the ratio of the wiring patterns connected to the ends of the connection electrodes from one direction and from the other direction.

FIG. 7 is a sectional view showing a package structure in which the semiconductor element 1 is mounted on the mounting substrate 20 according to the invention by being heated under pressure. The protruded electrode 12 of the semiconductor element 10 is bonded by being brought into contact with the central portion of the connection electrode 22 of the mounting substrate 20. Connecting substantially the same numbers of the wiring patterns 26 to the ends of the connection electrodes 22 from one direction and the other direction is particularly advantageous to mounting the semiconductor element 10 on the mounting substrate 20 without a slant, because the stress due to the pressure imparted for the mounting of the semiconductor element 10 acts on the semiconductor element 10 in a balanced way by being offset between the connection electrodes 22 having the ends to which the wiring patterns are connected from one direction and the other direction.

As described above, the design requirements for the semiconductor element 10 and the mounting substrate 20 limit the direction in which the wiring patterns 26 are connected to the connection electrodes 22. Therefore, exactly the same numbers of the wiring patterns 26 cannot necessarily be connected to the ends of the connection electrodes 22 from the two directions. Even in such a case, it suffices if the numbers of the wiring patterns connected to the ends of the connection electrodes 22 from the two directions are in the ratio in the range between 4 to 6 and 6 to 4.

According to the aspect of the invention shown in FIG. 6, each connection electrode 22 arranged in the opening 30 can be set to a length sufficient to bond the protruded electrode of the semiconductor element to the connection electrode 22 taking the amount of the solder deposited on the connection electrode 22 into consideration. In FIG. 6, although the end portion of the connection electrodes 22 is located in the opening 30, the end portion of the connection electrodes 22 can be extended so as to be covered with the protective film 32. Also, in FIG. 6, although the wiring patterns 26 are linearly arranged on the left and right sides of the connection electrodes 22, the wiring patterns 26 are not necessarily arranged linearly. Even in the case where the wiring patterns 26 are formed in various patterns other than linearly, the connection of substantially the same numbers of the wiring patterns 26 to the ends of the connection electrodes 22 from the two direction produces the same effect as described above.

FIGS. 8, 9, 10 and 11 illustrate a configuration of the mounting substrate and an underfill method whereby the semiconductor element 10 can be securely bonded to the mounting substrate 20 and the underfill material can be filled securely between the semiconductor element 10 and the substrate 20 without generating any void. In these drawings, the semiconductor element 10 mounted on the substrate 20 is indicated by a dotted line.

FIGS. 8 and 9 illustrate a case in which the semiconductor element 10 is bonded to the mounting substrate 20 and the underfill material 34 is filled by being injected in the direction parallel to the length of the row in which the connection electrodes 22 are arranged. FIGS. 10 and 11 illustrate a case in which the semiconductor element 10 is bonded to the mounting substrate 20 and the underfill material 34 is filled by being injected in the direction perpendicular to the length of the row in which the connection electrodes 22 are arranged. In either case, the underfill material 34 is injected uniformly from one edge toward the other edge over the entire length of the region at which the semiconductor element 10 is to be mounted.

In FIGS. 8 to 11, the substrates 20 shown in FIGS. 8 and 10 have the same configuration, and the substrates 20 shown in FIGS. 9 and 11 have the same configuration. The configuration difference between the substrates 20 of FIGS. 8, 10 and 9, 11 lies in the manner in which the opening 30 is arranged on the surface of the substrate 20 on which the semiconductor element is mounted.

With the substrate 20 shown in FIGS. 8, 10, the opening 30 on the surface of the substrate 20 is formed inside the area of the substrate 20 (inside the dotted line) where the semiconductor element 10 is mounted. With the substrate 20 shown in FIGS. 9, 11, in contrast, aperture edges 30a of the opening 30 on the surface of the substrate 20 are arranged outside the area of the substrate 20 in which the semiconductor element 10 is mounted.

The function of the opening 30 can be understood by comparing the functions of the underfills shown in FIGS. 8 and 9 with each other. FIGS. 8A to 8D schematically show the manner in which the space between the semiconductor element 10 and the substrate 20 comes to be filled by the underfill material 34 injected gradually from an end of the semiconductor element 10 in the direction longitudinal to the opening 30 formed on the surface of the substrate on which the semiconductor element is mounted.

Figure 8A:
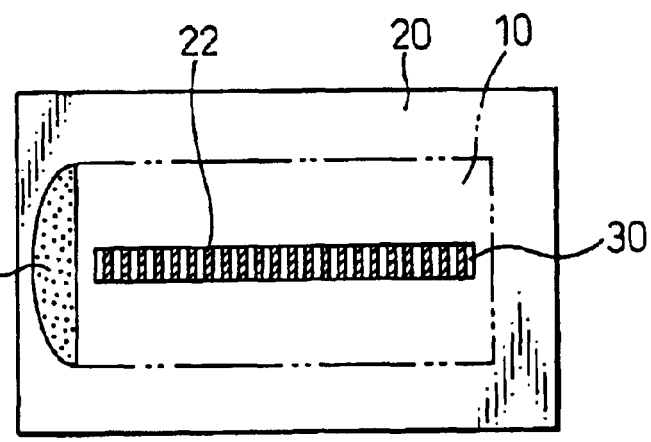
FIGS. 8A to 8D illustrate a method for applying an underfill material from the direction parallel to the line of the connection electrodes.
Figure 8B:
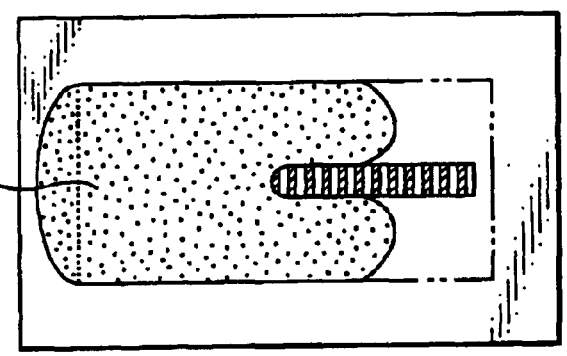
Figure 8C:
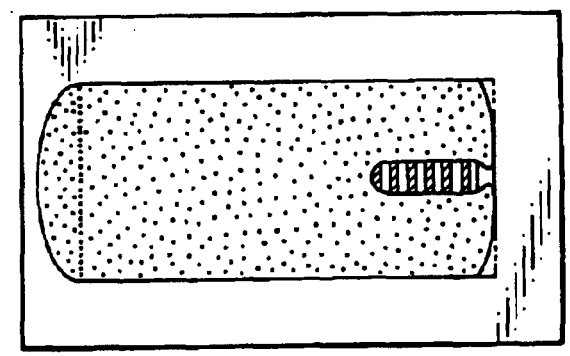
Figure 8D:
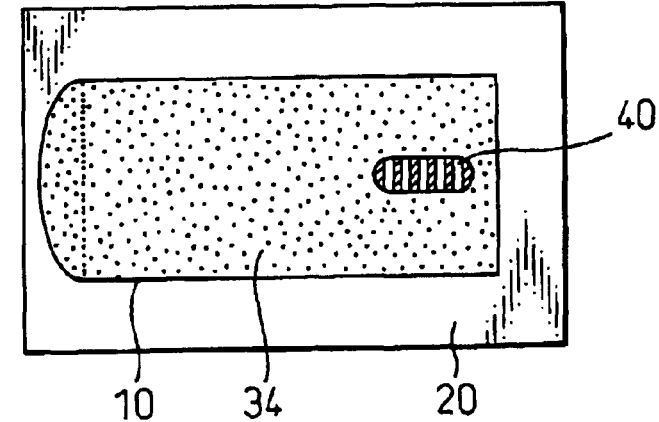
Figure 9A:
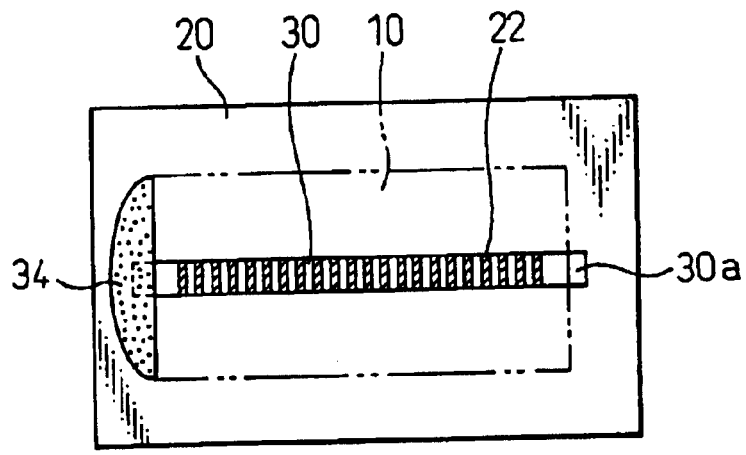
FIGS. 9A to 9D illustrate another method for applying an underfill material from the direction parallel to the line of the connection electrodes.
Figure 9B:
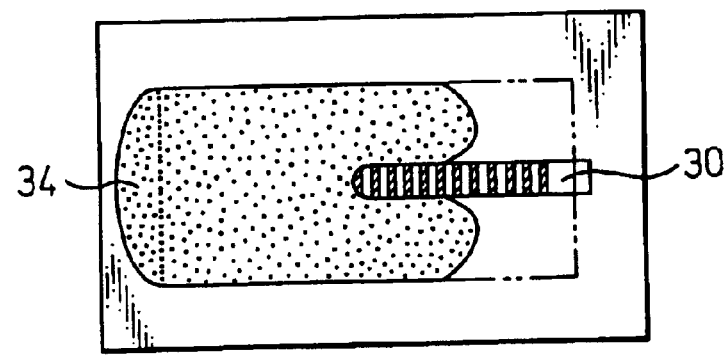
Figure 9C:
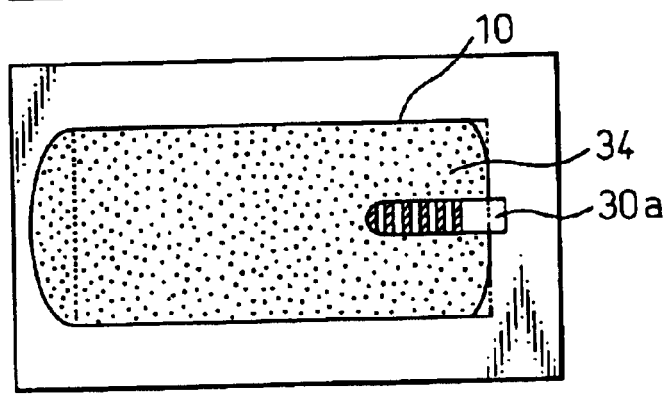
Figure 9D:
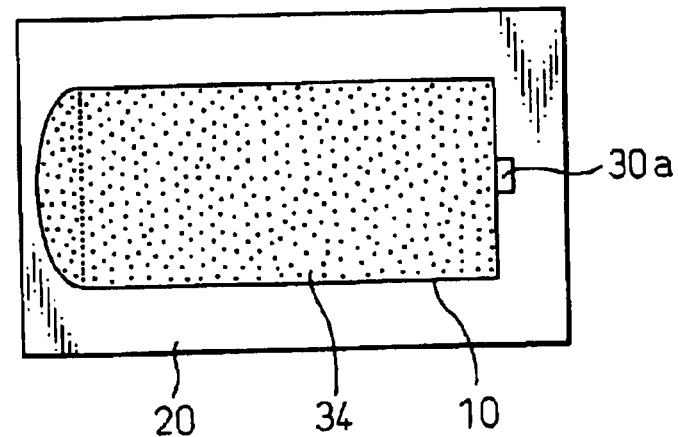

FIG. 8A shows the state in which the underfill material 34 is being injected from the left end of the semiconductor element 10, and FIG. 8B the state in which the underfill material 34 has been injected to the intermediate point. The injection of the underfill material 34 is retarded at the portion (opening 30) provided with the connection electrodes 22 wherein the protruded electrodes 12 (FIG. 7) of the semiconductor element 10 as well as the connection electrodes (FIG. 7) of the mounting substrate 20 are located. It is for this reason that the underfill material 34 is filled more slowly at the portion (opening 30) in which the connection electrodes 22 are arranged, as shown in FIG. 8B.

In the underfill method shown in FIG. 8, therefore, the underfill material that has reached the right end of the semiconductor element 10 through the area other than the opening 30 also intrudes into the opening 30 by circumvention from the right end of the opening 30 (FIG. 8C), with the result that a part of the opening 30 with the connection electrodes 22 arranged therein can be left without being injected with the underfill material 34 (FIG. 8D), giving rise to a void 40.

With the mounting substrate 20 shown in FIG. 9, on the other hand, the underfill material 34 begins to be filled from the left end of the semiconductor element 10 in the initial state (FIG. 9A) and injected in the same manner up to the intermediate state (FIG. 9B) as in the case of FIG. 8. As shown in FIG. 9C, however, the underfill material 34, which has filled the two sides of the connection electrodes 22 and reached the right end of the semiconductor element 10, can slowly intrude into the opening 30 from the right end of the semiconductor element 10. This is by reason of the fact that the opening 30 of the mounting substrate 20 has no protective film 32 (FIG. 7), which covers the other portion of the mounting substrate 20, and there is a step at the boundary between the opening 30 and the protective film 32, so that the underfill material 34 that has been filled in between the protective film 32 and the semiconductor element 10 slowly flows into the opening 30 at the step by the surface tension of the underfill material 34. The aperture edge 30a of the opening 30 is arranged so as to go beyond the end of the semiconductor element 10 outside the area in which the semiconductor element 10 is mounted, so that the underfill material 34 that has been filled at the two sides of the opening 30 is blocked at the aperture edge 30a of the opening 30 due to its surface tension. As a result, the underfill material 34 subsequently injected progressively fills up the opening 30 where the connection electrodes 22 are arranged. As shown in FIG. 9D, the underfill material is thus finally filled up over the entire area where the semiconductor element 10 is mounted.

As described above, according to the underfill method shown in FIGS. 8, 9, the underfill material 34 extends more quickly to the area at which the protective film 32 is located, while the opening 30 is filled with the underfill material 34 less quickly. In view of this, a method, shown in FIGS. 10, 11 has been conceived in which the underfill material 34 is injected from the direction perpendicular to the direction in which the connection electrodes 22 are arranged, so that the underfill 34 moves transversely to the portion where the connection electrodes 22 are arranged, with the intention of filling the underfill material 34 uniformly over the entire opening 30.

Figure 10A:
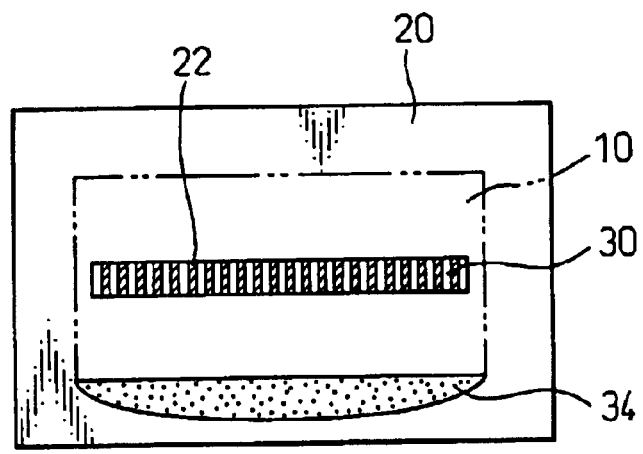
FIGS. 10A to 10D illustrate a method of applying an underfill material from the direction perpendicular to the line of the connection electrodes.
Figure 10B:
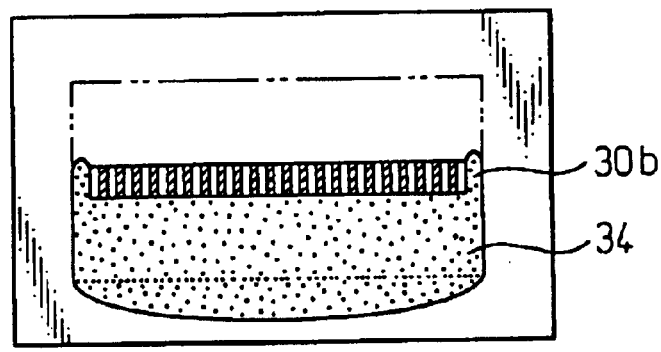
Figure 10C:
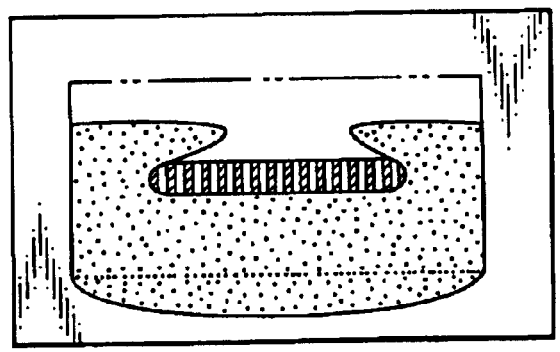
Figure 10D:
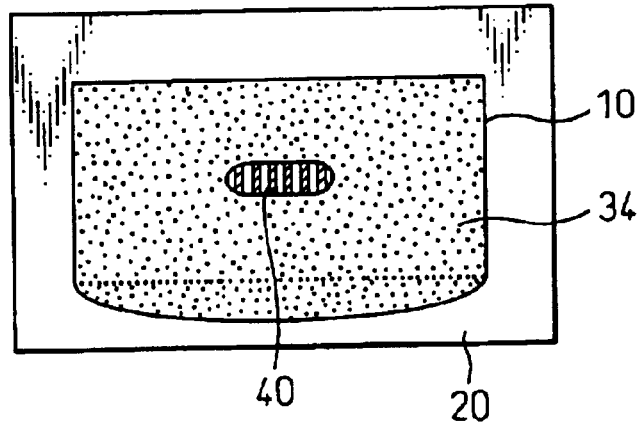

In the case where the opening 30 is arranged inside the area where the semiconductor element 10 is mounted (the area defined by the dotted line) as shown in FIG. 10, however, the underfill material 34 (FIG. 10A) injected from the lower edge of the drawing of the semiconductor element 10 circumvents the opening 30 and passes forward along the portions 30b which are covered with the protective film (FIG. 10B). Thus, the area with the connection electrodes 22 arranged therein comes to be surrounded by the underfill material 34 (FIG. 10C) with the result that the central portion of the area where the connection electrodes 22 are arranged sometimes leaves a void 40 (FIG. 10D).

Figure 11A:
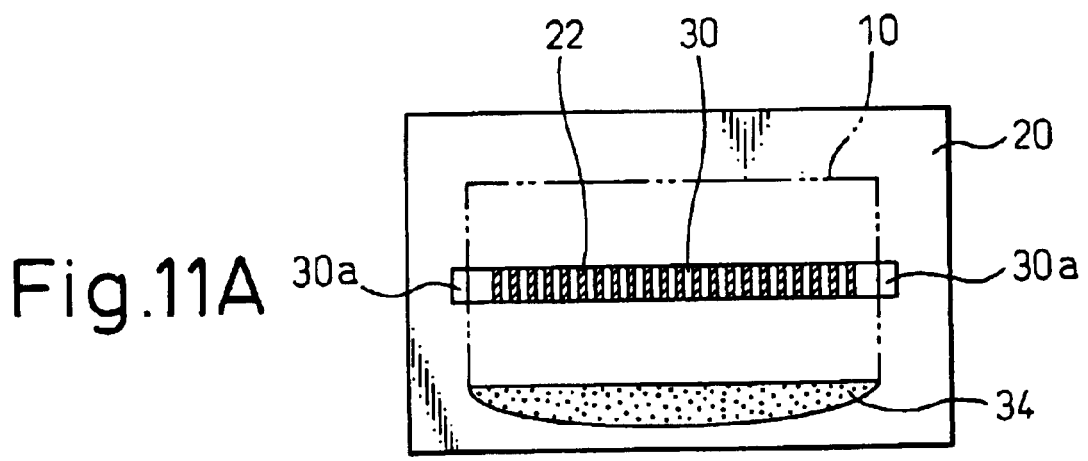
FIGS. 11A to 11D illustrate another method of applying an underfill material from the direction perpendicular to the line of the connection electrodes.
Figure 11B:
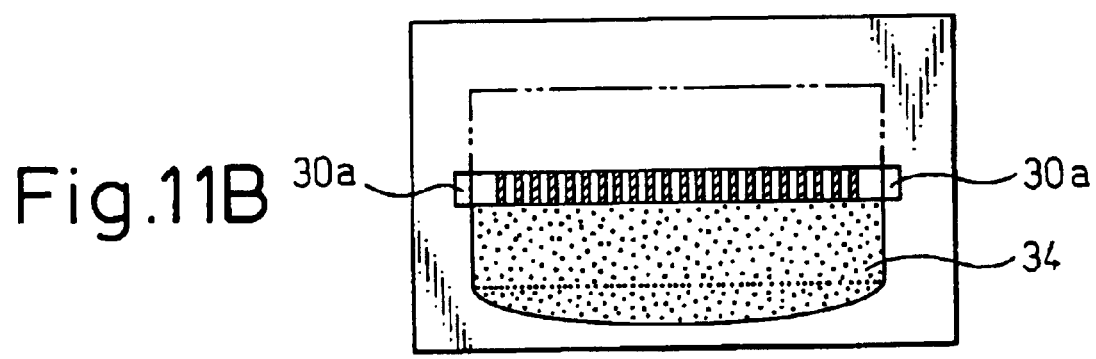
Figure 11C:
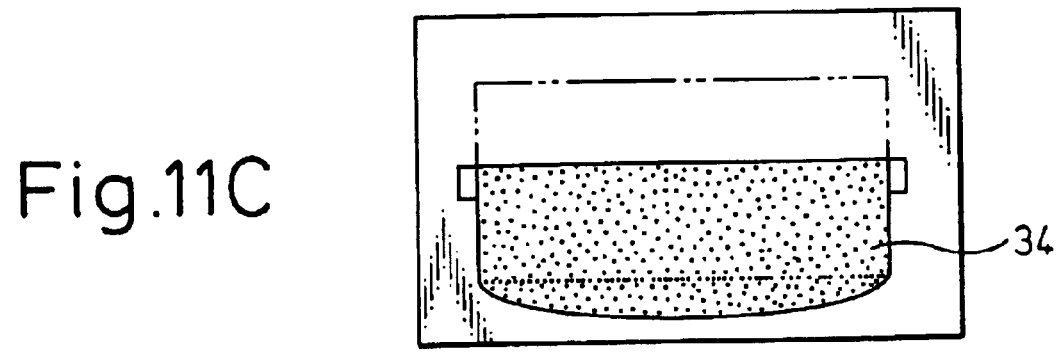
Figure 11D:
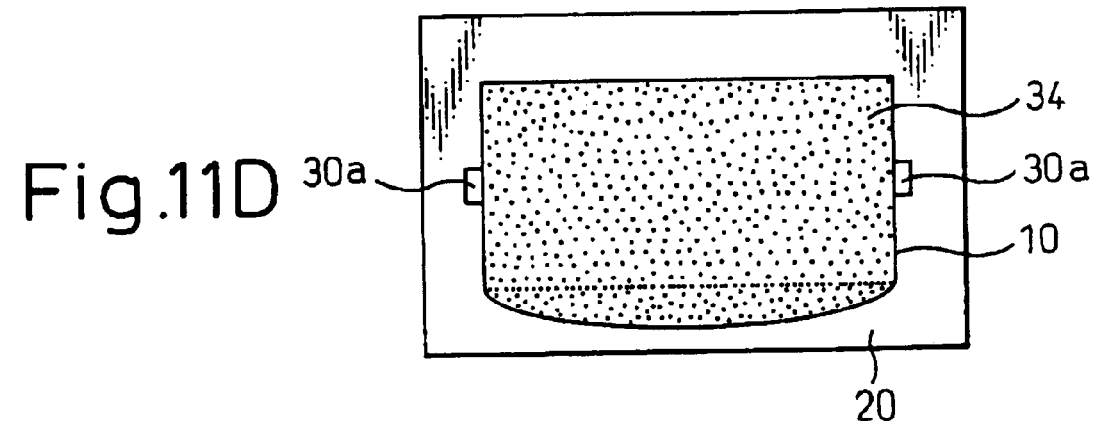
Figure 12:
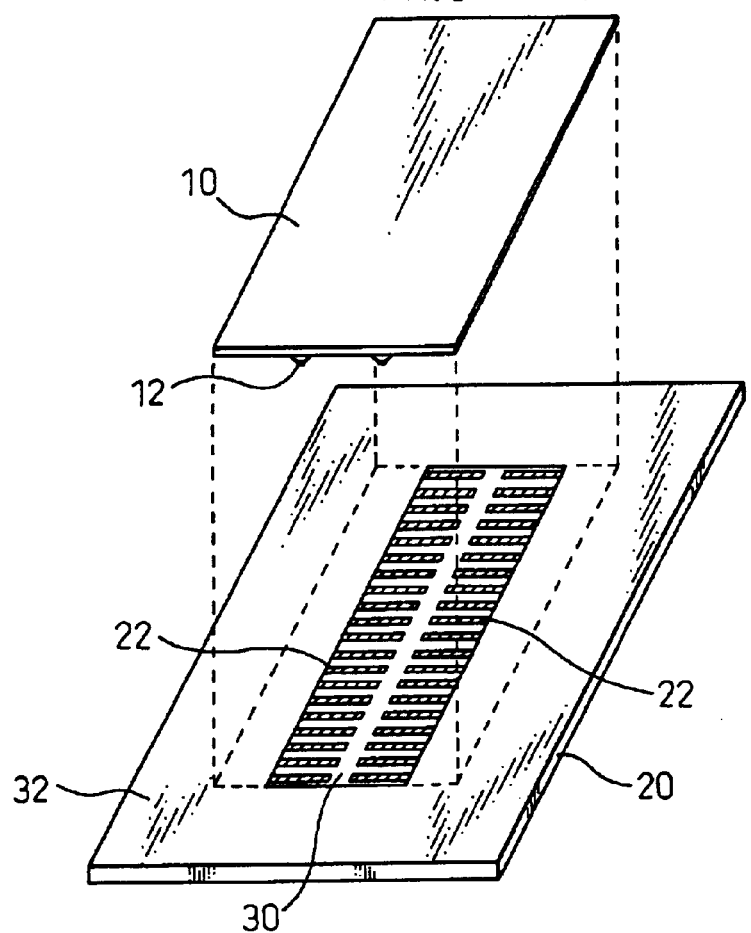
FIG. 12 illustrates a conventional structure in which a semiconductor element is mounted on a mounting substrate.
Figure 13:
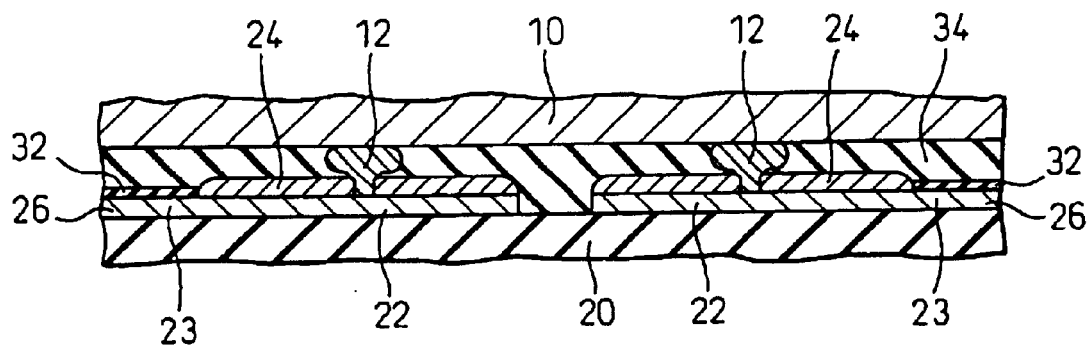
FIG. 13 is a sectional view of the conventional structure in which a semiconductor element is mounted on a substrate.

In the case where aperture edges 30a (FIG. 11A) of the opening 30 of the substrate 20 are arranged outside the area where the semiconductor element 10 is mounted, in contrast, the entrance of the underfill material 34 into the opening 30, which has been injected from the lower edge of the semiconductor element 10 and reached the opening 30 where the connection electrodes 22 are arranged, is controlled by its own surface tension (FIG. 11B). As a result, after being filled over the entire portion of the opening 30 where the connection electrodes 22 are located, the underfill material 34 extends beyond the opening 30 (FIG. 11C). Thus, the underfill material 34 extends over the area at which the semiconductor element 10 is mounted without leaving the underfill material unfilled at any portion where the connection electrodes 22 are arranged (FIG. 11D).

The underfill method shown in FIGS. 9, 11 makes suitable underfilling possible by an improvement of the configuration of the opening 30 in which the connection electrodes 22 are arranged. Even in the case where a multiplicity of the connection electrodes 22 are arranged at fine intervals, the above-mentioned design of the opening edges 30a makes a suitable underfilling possible. The aperture edges 30a of the opening 30, when arranged outside the area where the semiconductor element 10 is mounted, are located at a distance, though not specifically limited, of at least not less than 50 μm, or preferably in the range of 0.5 to 1 mm, from the boundary of that area.

With the mounting substrate and the structure according to the invention, as described above, the semiconductor element with the electrode terminals arranged thereon is mounted, by flip-chip bonding, without being slanted on the surface of the mounting substrate provided with the connection terminals, in such a manner that the protruded electrodes of the semiconductor element and the connection electrodes of the mounting substrate can be securely connected electrically to each other, thereby providing a highly reliable mounting structure. The reliability of the structure is further enhanced by the fact that the space between the semiconductor element and the substrate can be completely filled up with the underfill material.

What is claimed is:

1. A mounting substrate on which a semiconductor element is to be mounted by flip-chip bonding, the semiconductor element having a surface on which a plurality of electrode terminals are arranged in a line, each of said electrode terminals having a protruded electrode formed thereon, wherein the surface of the mounting substrate on which the semiconductor element is to be mounted is provided with a protective film having an opening corresponding to an area of the semiconductor element where the protruded electrodes are located, a plurality of connection electrodes being arranged in the opening, the connection electrodes being provided with a solder for bonding it to the protruded electrodes, and being arranged at the same interval as that of the protruded electrodes, and each of the connection electrodes being connected to a wiring pattern of the mounting substrate, and wherein the length of a portion of the connection electrode from the center of the opening to the end thereof that is not connected with the wiring pattern is 150 μm or larger.

2. A mounting substrate according to claim 1, wherein said connection electrodes extend from one edge of said opening to a position under the protective film beyond the other edge of the opening.

3. A mounting substrate according to claim 2, wherein the length of the portion of said connection electrodes from the center of said opening to the end thereof not connected with the wiring pattern is not less than 200 μm.

4. A mounting substrate according to claim 3, wherein said connection electrodes each have, at the central portion thereof located in said opening, a connection area wider than said wiring pattern, and have, at both sides of the connection area, an extension area of substantially the same width as said wiring pattern.

5. A mounting substrate according to claim 4, wherein the number of the wiring patterns connected to the connection electrodes from one side of the opening is substantially equal to the number of the wiring patterns connected to the connection electrodes from the other side of the opening.

6. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 5.

7. A mounting substrate according to claim 4, wherein said opening extends outside of the area on which said semiconductor element is to be mounted, in the same direction as the line of said protruded electrodes of said semiconductor element.

8. A mounting substrate according to claim 7, wherein said opening extends not less than 50 μm outside of the area on which said semiconductor element is to be mounted.

9. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 8.

10. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 7.

11. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 4.

12. A mounting substrate according to claim 3, wherein the number of the wiring patterns connected to the connection electrodes from one side of the opening is substantially equal to the number of the wiring patterns connected to the connection electrodes from the other side of the opening.

13. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 12.

14. A mounting substrate according to claim 3, wherein said opening extends outside of the area on which said semiconductor element is to be mounted, in the same direction as the line of said protruded electrodes of said semiconductor element.

15. A mounting substrate according to claim 14, wherein said opening extends not less than 50 µm outside of the area on which said semiconductor element is to be mounted.

16. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 15.

17. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 3.

18. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 14.

19. A mounting substrate according to claim 2, wherein the number of the wiring patterns connected to the connection electrodes from one side of the opening is substantially equal to the number of the wiring patterns connected to the connection electrodes from the other side of the opening.

20. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 19.

21. A mounting substrate according to claim 2, wherein said opening extends outside of the area on which said semiconductor element is to be mounted, in the same direction as the line of said protruded electrodes of said semiconductor element.

22. A mounting substrate according to claim 21, wherein said opening extends not less than 50 µm outside of the area on which said semiconductor element is to be mounted.

23. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 22.

24. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 21.

25. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 2.

26. A mounting substrate according to claim 1, wherein the number of the wiring patterns connected to the connection electrodes from one side of the opening is substantially equal to the number of the wiring patterns connected to the connection electrodes from the other side of the opening.

27. A mounting substrate according to claim 26, wherein said opening extends outside of the area on which said semiconductor element is to be mounted, in the same direction as the line of said protruded electrodes of said semiconductor element.

28. A mounting substrate according to claim 27, wherein said opening extends not less than 50 µm outside of the area on which said semiconductor element is to be mounted.

29. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 28.

30. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 27.

31. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 26.

32. A mounting substrate according to claim 1, wherein said opening extends outside of the area on which said semiconductor element is to be mounted, in the same direction as the line of said protruded electrodes of said semiconductor element.

33. A mounting substrate according to claim 32, wherein said opening extends not less than 50 μm outside of the area on which said semiconductor element is to be mounted.

34. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 33.

35. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 32.

36. A structure in which a semiconductor element is mounted on a substrate by flip-chip bonding, the semiconductor element having a surface on which a plurality of electrode terminals are formed so as to be arranged in a line, each of the electrode terminals having a protruded electrode formed thereon, wherein an underfill material is filled in the space between the surface of the semiconductor element provided with the electrode terminals and the mounting substrate, and wherein the substrate is the mounting substrate according to claim 1.

* * * * *